United States Patent [19]

Di Zenzo et al.

[11] Patent Number: 5,541,938
[45] Date of Patent: Jul. 30, 1996

[54] METHOD AND APPARATUS FOR MAPPING MEMORY AS TO OPERABLE AND FAULTY LOCATIONS

[75] Inventors: Maurizio Di Zenzo, Rieti; Pasquale Pistilli, Avezzano; Adelio Salsano, Rome, all of Italy

[73] Assignee: Texas Instruments Incorporated, Dallas, Tex.

[21] Appl. No.: 209,580

[22] Filed: Mar. 11, 1994

[30] Foreign Application Priority Data

Mar. 12, 1993 [IT] Italy .................................. RM93A0155

[51] Int. Cl.⁶ ..................................................... G06F 11/00
[52] U.S. Cl. ..................................... 371/40.1; 395/182.04; 371/21.6
[58] Field of Search ................................... 371/10.1–10.3, 371/11.1, 21.6, 40.1; 365/200, 201, 230.3, 230.6; 364/DIG. 1; 395/182.03–182.06, 412

[56] References Cited

U.S. PATENT DOCUMENTS

| | | | |
|---|---|---|---|
| 4,653,050 | 3/1987 | Vaillancourt | 371/10.1 |
| 4,939,694 | 7/1990 | Eaton et al. | 365/200 |
| 5,067,105 | 11/1991 | Borkenhagen et al. | 371/10.2 |
| 5,077,737 | 12/1991 | Leger et al. | 371/10.1 |

*Primary Examiner*—Paul P. Gordon
*Assistant Examiner*—Steven R. Garland
*Attorney, Agent, or Firm*—William E. Hiller; Richard L. Donaldson

[57] ABSTRACT

System for enabling the use of semiconductor dynamic memories having faulty locations therein where the memory is organized in banks for forming an elementary information word. The system identifies all homologous address locations which are not faulty, and the non-faulty locations are then stored as a map in a non-volatile read-only-memory related to the memory bank so as to form a transcoding table. Access to the memory blocks involves the use of a central processing unit requesting access to a block identified by a sequential address. The system then provides for associating the material address of a block of the memory array to the logical address, this association or transcoding operation being carried out by the non-volatile read-only-memory.

16 Claims, 10 Drawing Sheets

METHOD AND APPARATUS FOR MAPPING MEMORY AS TO OPERABLE AND FAULTY LOCATIONS

This invention broadly relates to a method and to circuitry to enable use of partially operative memories, that is memories having faulty locations, as well as to an equipment for mass production of suitable mapped memory blocks and for large scale exploitation of such circuit approach.

More particularly, a first aspect of this invention is related to focusing a method to utilize semiconductor dynamic memories having manufacturing defects, namely memories having faulty locations and as such not utilizable in conventional applications.

In a second aspect, this invention relates to a circuit approach adapted to exploitation of such a method and, therefore, adapted to detect and to correct errors not detectable or not correctable by means of approaches according to the prior art.

In a third aspect, this invention relates to an equipment for mapping or practically testing single memory modules and for permanently storing the final map in an OTP (One Time Programmable) memory, in order to enable use of said memory modules in the circuitry and according to the method of this invention

BACKGROUND OF THE INVENTION

Based upon statistical considerations involving the inherent defectiveness of the silicon crystal lattice, the defectiveness induced by foreign particles into the internal geometrical structures of the integrated circuits and the defectiveness induced by swings of the production process parameters into the internal structures of the integrated circuits, it can be argued that the production efficiency of the memory circuits is a monotonically decreasing function of the utilized silicon surface and in effect of the number of memory calls utilized on a single chip.

A close analysis of the damages materially caused, however, shows that the concerned memory devices have only a few rows or a few columns or a few tens of not operative locations. Furthermore, such defects can be detected only in very severe operation conditions, hardly simulatable without particular test equipment. Anyway, notwithstanding this "scarce" defect occurrence rate, said faulty memories cannot be employed in such applications as memory banks for traditional computers.

Taking as a base the observation that, since the memories as presently used can be considered as byte-oriented, the immediate solution to map all faulty bytes cannot be adopted, because as a matter of fact, such a step would require more information than one could subsequently store, this invention is based upon the concept of developing a memory array adapted to operate by blocks and then of retrieving memory blocks, rather than memory bytes, thereby renouncing to develop a byte-oriented memory array, fully compatible with the memory arrays conventionally utilized in present computers.

Based upon this concept, therefore, a first step aimed at making such memory devices utilizable provides for organizing them as memory banks in order to form an elementary information "word", as it occurs in conventional applications, and, thereafter, it provides for identifying all not-faulty homologous address locations: this is carried out at predetermined supply voltage and temperature conditions, as it will be illustrated, and, since the obtained results generally are not coincident, only those locations which have been positively tested are selected.

The result of this step, which is defined as "mapping", is stored in a not-volatile OTP memory associated to the memory bank.

The external user, who desires to retrieve the data stored in the various memory blocks, will have access to them by utilizing successive (logical) memory addresses and will exploit to this aim the operation of this not-volatile memory which will provide for transcoding the map stored therein into the (material) addresses associated to the memory banks. In other words, the access to the memory blocks is developed in two successive stages. In a first stage, the intelligent portion of the system, for instance a central processing unit (CPU), requests an access to a block identified by a sequential (logical) address. At this point, the system provides for associating the material address of a block of the memory array to said logical address. This association or transcoding operation is carried out by said not-volatile memory. As a matter of fact, the user receives a logical address from outside, gets access to said address of the OTP memory, retrieves the content thereof and utilizes it for a direct and immediate access to the correspondent material block of the memory array.

All above set forth steps, however, represent only a portion of the whole method, because:

it can be reasonably believed that the originally faulty memory chips can be degraded in the long run more easily than perfectly operating chips, and therefore, they can subsequently have faulty locations even if such locations may have originally proved as error-free, troublesome variations of the number of error-free locations could be encountered, which could cause manufacturing problems, because it is necessary that each memory bank has a certain minimum number of error-free locations.

According to the rule, as it has already observed, all faulty locations should be identified, but this wold pose an excessively severe constraint.

Aiming at solving this problem and at providing a system adapted to be operative also when some defectiveness exists and also aiming at enlarging the number of locations wherein it is possible to store information, by utilizing also regions featuring a limited defectiveness, a second stage of the method according to this invention provides for applying techniques designed for error correction (ECC).

More particularly, the developed technique is based upon the theory of the cyclic polynomial codes and specially upon the REED-SOLOMON code with generator polynomial $$g(x)=x^4+a^{201} \cdot x^3+a^{246} \cdot x^2+a^{201} \cdot x+1$$

The R-S code has been adopted, among other, because it is not byte-oriented, but it is oriented on the base of a character string and it can be realized by acting upon the code parameters with desired redundancy. In the case of this invention, a redundancy of 12.5% has been adopted.

Since the block as not considered is a 512 byte block (such number has been adopted since it corresponds to that of a conventional peripheral equipment) and since some difficulties would be encountered in embodying such a function into a silicon wafer, it is proposed to divide the 512 byte string into various sub-strings and to determine the correction bytes for each sub-string.

Clearly, this approach does not utilize the R-S code in optimal manner. In fact, in a R-S type code, if a 512 byte string and 64 control bytes are considered, up to 32 bytes can be corrected, regardless of the positions they occupy in the string. On the contrary, thanks to the proposed division, according to which 32 byte sub-strings plus 4 control bytes are provided, only 2 bytes can be replaced in a 32 byte string and this can be made only in the considered string and cannot be made in other strings. The capability of the code is rather reduced, but the arrangement is found to be satisfactory, with respect to the number of the logic gates that should be implemented and to the whole necessary equipment.

Further details and advantages of this invention will be evident from the following specification by referring to the enclosed drawing wherein the preferred embodiment is shown by way of illustration and not by way of limitation.

DESCRIPTION OF PREFERRED EMBODIMENT

Figure 1:
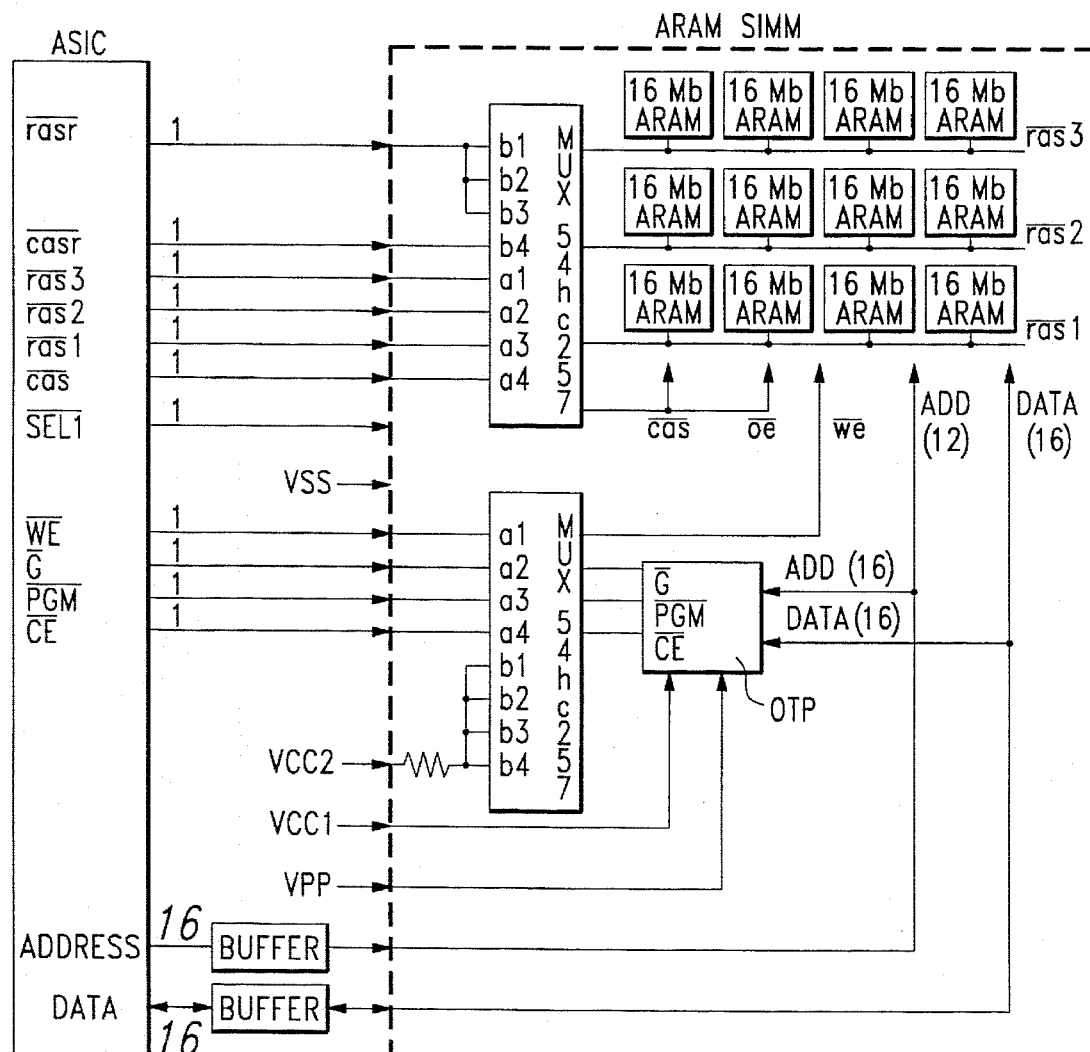
FIG. 1 shows a block diagram of a circuit to implement the use method for partially faulty memories according to this invention.

By referring now at first to FIG. 1, it can be observed that the basic concept of this invention is implemented by means of an arrangement of a memory array that, in the embodiment shown therein, comprises a matrix of 3×4 16 Mb ARAM memories, which can include memories with faulty locations that can be used according to this invention. A not volatile OTP memory wherein the "map" of the locations of the memory bank is stored is associated to said memory matrix. Furthermore, a user circuit (ASIC) is shown which can have access to the memory bank by using successive (logical) memory addresses supplied thereto by an intelligent portion of the circuit, for instance a central processing unit (CPU). Such access can be obtained by using said not volatile memory OTP that converts the logical address requested by the user into a material address of the memory array. As a matter of fact, the user circuit receives from outside a logic address and utilizes it to gain access to said OTP memory which, in turn, supplies to it a material address that enables it to obtain direct access to the memory bank.

As it has above mentioned, aiming at utilizing regions characterized by a limited number of faulty locations by means of techniques designed for error correcting applications, a technique has now been developed based upon the cyclic polynomial code theory, in particular the Reed-Solomon code with generator polynomial $$g(x)=x^4+a^{201}.x^3+a^{246}.x^2+a^{201}.x+1$$

For the sake of convenience, it has been chosen to divide the information elementary or unit strings into groups of 32 characters (8 bits per character). The R-S code adds 4 characters to each of said groups for error control. In this manner, it is possible to correct two error-affected characters in a string comprising 36 characters in total. During the decoding procedure the syndrome block consisting of four characters is computed and a test is carried out in order to search one or two errors.

When a procedure based upon the conventional decoding technique is followed, it is possible to correct one error and two errors can be corrected only if they are included in four successive characters. This allows also character strings containing one error to be considered as good, otherwise such strings would be eliminated during the mapping stage.

This approach, however, is not completely satisfactory, in that the dynamic memories are subject to the well known phenomenon of the "soft error" caused by incidence of the alpha particles by which the information content of the memory cells can be modified. When such a phenomenon affects a character contained in a block wherein an erroneous character is already present, due to a faulty cell, in total two errors should be corrected, placed at a distance greater than three locations.

This problem has been solved by developing a change to be made in the conventional decoding technique by addition of test circuits (test patterns) which enable two errors placed at any locations to be detected and corrected. This technique provides for translating the 36 character string in such a manner as to move an error always to the first location of the string and for adding specialized circuits designed to detect an error located in the first location plus a further error located in anyone to the locations pertaining thereto and to correct the error existing in the first position:

| circuit number | positions |
| --- | --- |
| 0 | 1-2-3-4 |
| 1 | 1-5-6-7-8 |
| 2 | 1-9-10-11-12 |
| 3 | 1-13-14-15-16 |
| 4 | 1-17-18-19-20 |
| 5 | 1-21-22-23-24 |
| 6 | 1-25-26-27-28 |
| 7 | 1-29-30-31-32 |
| 8 | 1-33-34-35-36 |

The operation is based upon the fact that the test circuit identifies a particular polynomial structure, which indicates the presence of an error in a byte assembly. Each test circuit evidences the presence of errors in 5 particular positions, so that 9 test circuits are needed to analyse all 36 positions.

Figure 3:
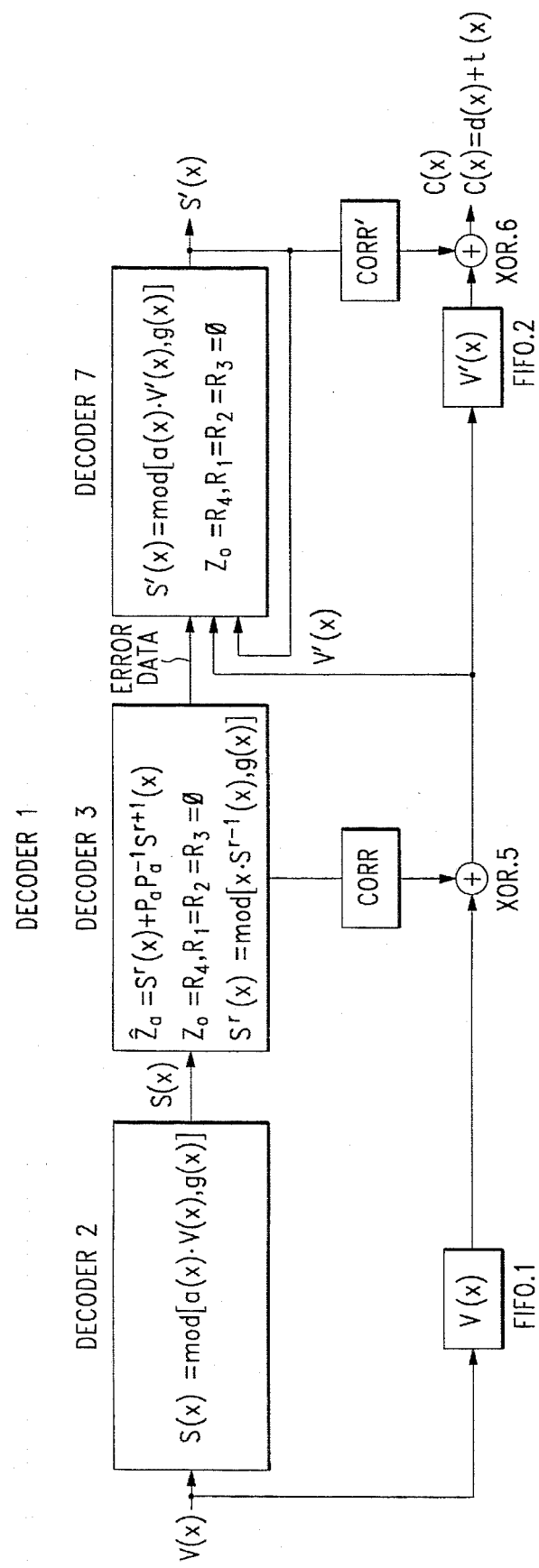
FIG. 3 shows a block diagram, also including the mathematics implemented in the various sections, of a decoder (1) that can be utilized for practical implementation of this invention.
Figure 5:
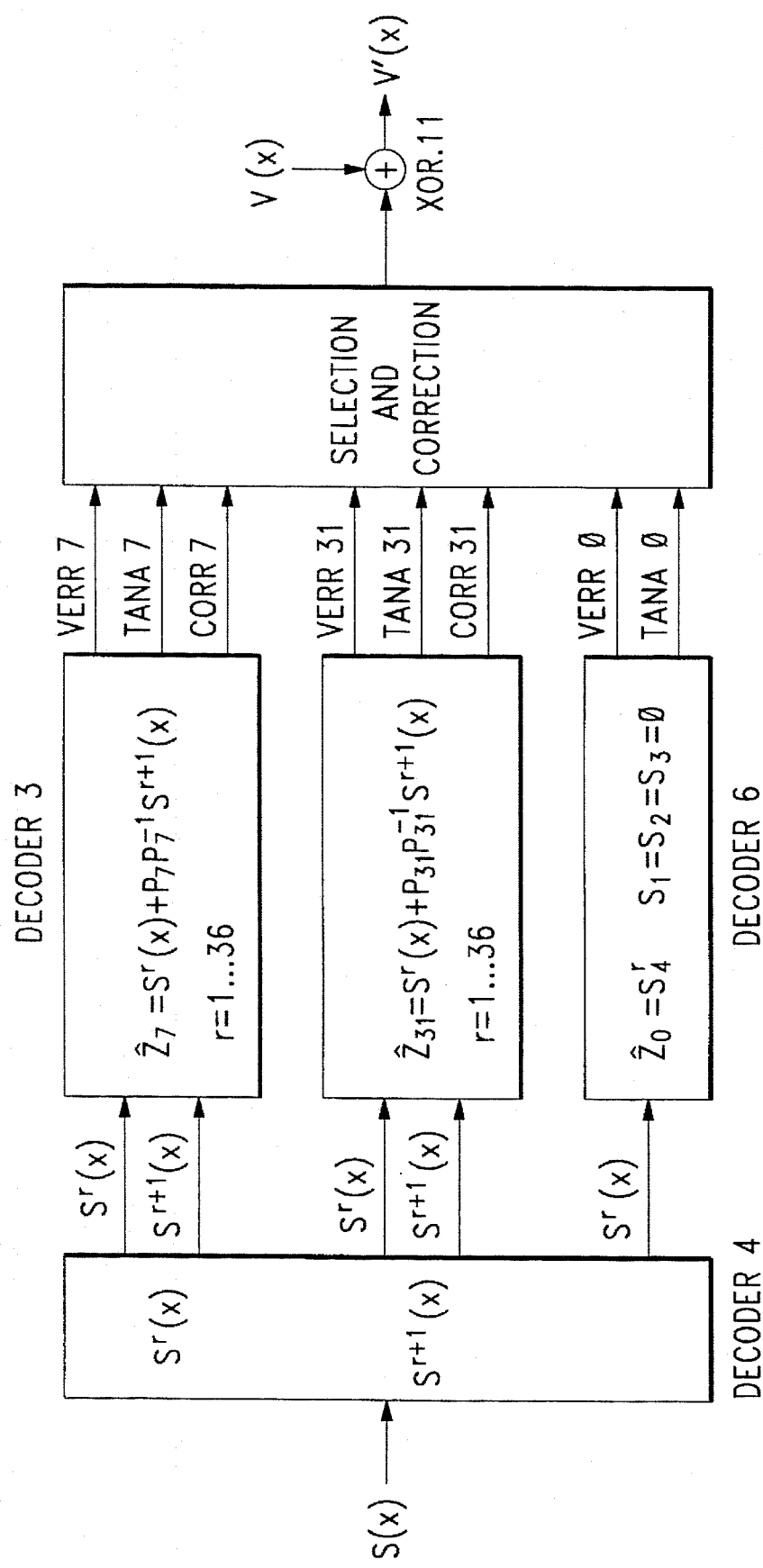
FIG. 5 shows a block diagram, also including the mathematics implemented therein, of decoder (3) included as a part of decoder (1) of FIG. 3.

As it can be seen in FIG. 3, at the decode stage, the concerned 36 bytes are applied to a decoder circuit 1 which computes the syndrome S(x) and transmits it in parallel to those test circuit having a level higher than zero (Decoder 3; FIGS. 3 and 5).

Assuming that only two errors are present in whichever position, one only of such test circuits will succeed in locating the errors and in correcting the one being in the first position.

At this point, the 36 bytes containing one only error are applied to another block, namely Decoder 7, for computation of the new syndrome. The test circuit of zero order or level can now operate upon such syndrome, this circuit being capable to correct errors located at a distance equal or less than three.

Lastly, the correct block will furnish the output signal from the circuit.

Should the number of errors be greater than two, the circuit limits itself to outputting an indication that it is not capable to correct the errors occurred.

In order to make the technique aimed at correcting the errors more efficient, also an approach aimed at suitably arranging the bytes related to the various characters into the memory has been considered. In particular, aiming at exploiting the capability of the code to consider a whole erroneous byte as a single error, it is proposed to arrange the various bytes in eight successive memory locations in the same row, by using a transposition circuit. Such circuit receives into its input the bits of a single 16-bit word which, due to the parallelism effect of the memory chips, would be arranged in homologous but not adjacent locations and transposes them by using a local memory or buffer, so that they can be arranged in adjacent cells of the memory, grouped in the same row. In this manner, the defectiveness of the chips involving adjacent cells in the same memory row can affect one only byte and consequently can be considered as a single error.

The mathematical theory from which this invention was derived is based upon an improved Reed-Solomon algorithm, which will be now described.

R-S Parameters

| name | formula | value |
| --- | --- | --- |
| word length | m | 8 |
| alphabet symbols | $2^m$ | 256 |
| data string length | k' | 32 |
| correctable errors | t | 2 |
| control bytes | r = 2t = n − k | 4 |
| coded string length | n' | 36 |

Remark: The normal code R-S has been restricted from a length of 255 bytes ($n = 2^m - 1 = k + 2t$) to 36 bytes by applying the "shortened techniques" n' = n − b = 256 − 219 = 36.
Such techniques entail multiplication of the data string n' and of the polynomial $a(x) = a^{224} \cdot x^3 + a^{189} \cdot x^2 + a^{182} \cdot x + a^{92}$.

A systematic coding technique is adopted in order to maintain the data coefficients (locations 36-5) separate from the control byte coefficients (locations 4-1).

As above mentioned, the error correction code ECC as implemented is byte-oriented due to the specific character of the problem (the memory banks are organized as 16-bit words and the data items are located in the memory chips in such a manner as to minimize the effect of the errors upon the data bytes).

Description of the polynomial

| name | description | formula | grade |
| --- | --- | --- | --- |
| p(x) | primitive | $x^8 + x^4 + x^3 + x^2 + 1$ | 8 |
| d(x) | data | not applicable | 31 |
| g(x) | generator (1) | $x^4 + a^{201} \cdot x^3 + a^{246} \cdot x^2 + a^{201} \cdot x + 1$ | 4 |
| c(x) | coded data (2) | $x^4 \cdot d(x) - t(x)$ | 35 |
| t(x) | control | mod[$x^4 \cdot d(x)$, g(x)] | 3 |
| v(x) | received | C(x) + e(x) | 35 |
| e(x) | error | not applicable | 35 |
| s(x) | syndrome | mod[$a(x) \cdot v(x)$, g(x)] | 3 |
| a(x) | restricted | $a^{225} \cdot x^3 + a^{189} \cdot x^2 + a^{182} \cdot x + a^{92}$ | 3 |

(1) The polynomial has been generated by applying the following formula:
$g(x) = (x - aj)(x - a^{(j+1)})(x - a^{(x+2)})(x - a^{(j+3)})$
wherein: $j = 2^{m-1} - 2 = 126$
$a = \text{mod}[x, p(x)]$.
(2) The systematic coding technique maintains the coefficients of the data bytes unaltered
$c(x) = x^4 \cdot dx - t(x)$
$t(x) = \text{mod}[x^4, g(x)]$

DECODING

Computation of the Syndrome

It is not possible to directly use the well known formula:

$$s(x) = \text{mod}[v(x), g(x)] = \text{mod}[c(x) + e(x), g(x)]$$

because it is valid only for one code (255, 251), but it is possible to transform the original v(x) for it to be compatible with the code and we shall have b=255−36 items equal to zero and all other (not original) items not equal to zero. To this purpose, the following formula is used:

$$a(x) = \text{mod}[x^{n-k+b}, g(x)]$$

wherein n−k+b=223.
The formula to be applied for s(x) is:

$$s(x) = \text{mod}[a(x) \cdot v(x), g(x)]$$

A further problem to be solved is that the shortened or restricted code R-S is not able to detect and correct t errors in the polynomial as received, unless the following condition is fulfilled $$t < n/k$$

which, in the present case, is 1.125. Anyway, when the distance between the t errors is lower or equal to 2t, the original capabilities of the R-S code are still exploited and an error located in any location can be corrected. In view of this, a two stage ECC technique is implemented, wherein a first stage is adapted to detect and correct on error in the range of predetermined locations and solves the problem relating to the presence of two errors outside of the coverage of the syndrome (4 bytes), a second stage is adapted to correct 1 or 2 errors within the coverage of the syndrome.

First Stage $$s(x) = \mod [e(x), g(x)]$$

$$e(x) = e_d(x) + e_c(x)$$

wherein:

$e_d(x)$ is the polynomial associated with the error relating to the data bytes; its degree is n–k and positions 0, 1, 2, 3 have coefficients equal to zero, and wherein $e_c(x)$ is the polynomial associated with the error affecting the control bytes; its degree is n–k–1.

Since $e_d(x)$ can be represented as $$e_d(x) \text{ eps} \cdot x^{n-k-1} \quad 0 < l < k$$

then $$s(x) = \mod [\text{eps} \cdot x^{n-k-l} + e_c(x), g(x)] = \text{eps} \cdot p_1(x) + e_c(x)$$

$$e(x) = \text{eps} \cdot x^{n-k+1} + s(x) - \text{eps} \cdot p_1(x)$$

and considering that in the case under examination the degrees of s(x) and of $e_c(x)$ are lower than 3, then $$x^{n-k+1}$$

provides information relating to the position and to the value of the error in the data string.

By computing a special syndrome relating to a possible error in position n–k–1, an error could be corrected in positions ranging from 1+1 to n–k+1. The problem, therefore, can be solved by segmenting V(x) into n/4 sub-strings and by computing n/4 syndromes associated with the above set forth monomials Summarizing the synthesizing:

| 1  | monomial       | positions of V(x) |    |    |    |
|----|----------------|-------------------|----|----|----|
| 0  | not applicable | 0                 | 1  | 2  | 3  |
| 3  | $x^7$          | 4                 | 5  | 6  | 7  |
| 7  | $x^{11}$       | 8                 | 9  | 10 | 11 |
| 11 | $x^{15}$       | 12                | 13 | 14 | 15 |
| 15 | $x^{19}$       | 16                | 17 | 18 | 19 |
| 19 | $x^{13}$       | 20                | 21 | 22 | 23 |
| 23 | $x^{27}$       | 24                | 25 | 26 | 27 |
| 27 | $x^{31}$       | 28                | 29 | 30 | 31 |
| 31 | $x^{35}$       | 32                | 33 | 34 | 35 |

Determination of the Error Values

Considering that $$z_1(x) = p_1(x)^{-1} \cdot s(x) = \text{eps} + p_1(x)^{-1} \cdot e_c(x)$$

$$z_0 = \text{eps} + p^{-1}_{a,0} e_{c,0} = p^{-1}_{a,0} s_0$$

$$z_1 = \text{eps} + p^{-1}_{a,1} e_{c,1} = p^{-1}_{a,1} s_1$$

$$z_2 = \text{eps} + p^{-1}_{a,2} e_{c,2} = p^{-1}_{a,2} s_2$$

$$z_3 = \text{eps} + p^{-1}_{a,3} e_{c,3} = p^{-1}_{a,3} s_3$$

and in the assumption that an error is present in $e_c(x)$, with eps=0 (no error in $e_d(x)$), the values in $Z_1(x)$ not equal to zero are the values of the errors, and all other (3) values are equal to zero. Should $e_d(x)$ be affected by errors, eps=0

The above results can be extended to the data bytes by rotating the polynomial V(x) of r locations and by computing the related syndrome:

$$S^r(x) = x^r S^{r-1}(x) + S^{r-1} \cdot g(x)$$

In order to make the computation of the error value and the determination of the error position easier, a modified polynomial is used $$z_{1,0} = s_0 + p_{1,0} \cdot p^{-1}_{1,1} \cdot s_1$$

$$z_{1,1} = s_1 + p_{1,1} \cdot p^{-1}_{1,2} \cdot s_2$$

$$z_{1,2} = s_2 + p_{1,2} \cdot p^{-1}_{1,3} \cdot s_3$$

$$z_{1,3} = s_3 + p_{1,3} \cdot p^{-1}_{1,0} \cdot s_0$$

and by substitution it can be demonstrated that the conditions $Z_{a,i}$=eps for 3 coefficients and $Z_{a,i}$=eps for the last one are transformed to $$Z_{a,i} = Z_{a,i+1} = 0 \text{ and } Z_{a,i-1} = e_j$$

which is the coefficient of the error related polynomial.

This technique is adapted to correct an error in fixed sub-strings of V(x), but it is not adapted to detect and to correct a pair of errors; then a further control is implemented for indicating to the subsequent stage that a second rotation of V(x) may be necessary.

Second Stage

After having filtered off the errors spaced apart by a distance greater than 4 bytes, a decoding technique for trapping the error can be implemented, based upon modified V(x):

$$S'(x) = \mod [a(x) V'(x), g(x)]$$

and, therefore, cycles of $V_1(x)$ for correcting the second stage error are performed once or twice, depending on the number of errors to be corrected.

Circuit Implementations

To compute S(x), $x^r S(x)$, S'(x) the following recursive formula is applied and implemented:

$$R^r(x) = R^{(r-1)} - g(x)(R^{r-1}_{n-r}, x^{k-r})$$

wherein $R^r(x)$ is the polynomial at the "r" stage and $R^{r-1}_{n-r}$ is the (n–r) coefficient of the polynomial.

Figure 2A:
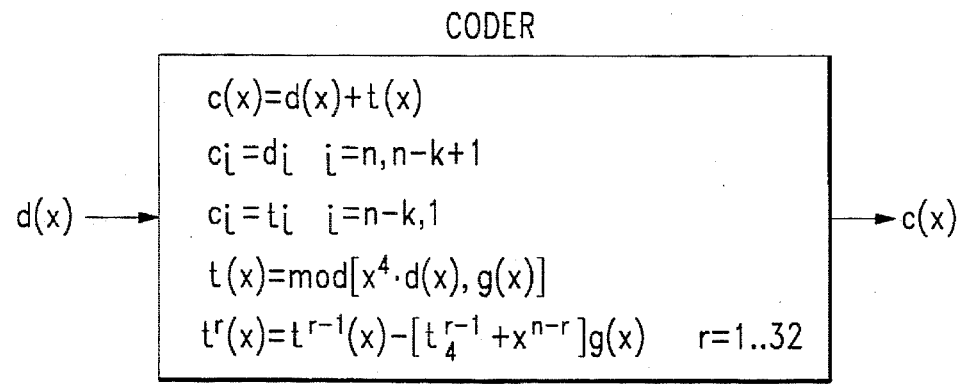
FIGS. 2A and 2B respectively show as a separate block, including the mathematics implemented therein, the circuit arrangement of a coder than can be utilized for practical implementation of this invention.
Figure 2B:
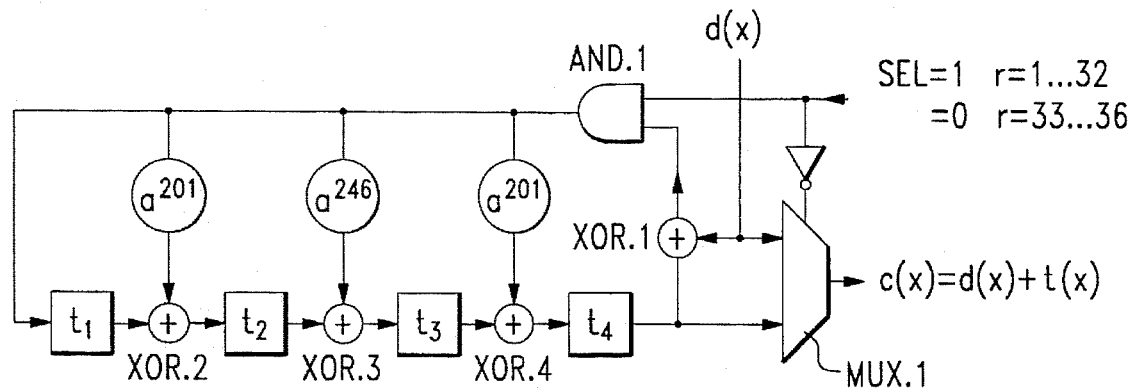

As far as the circuit approaches are concerned by which the above set forth mathematics are implemented, particular reference is now made to the Figures. In FIGS. 2A, 2B the coder and the mathematics implemented therein are shown.

In the circuit design aspect, it comprises a ladder network to which input signals d(x) and SEL are applied. Signal d(x) is coupled to a 8-bit XOR.1 circuit, inserted in a first transverse arm of the ladder, and to a first input of an output multiplexer MUX. Signal SEL is coupled to a first gate AND.1 inserted in the first longitudinal leg of the ladder and having its other input connected to said circuit XOR.1. In the other two transversal arms of the ladder, circuits $a^{201}$, $a^{256}$ and $a^{201}$ are included, consisting of modulo g(x) 8-bit multiplier circuits. In the second longitudinal legs of the ladder master-slave flip-flop circuits $t_1$, $t_2$, $t_3$ and $t_4$ are inserted and a second, a third and a fourth circuits XOR.2, XOR.3 and XOR.4 are inserted in the respective nodes between the longitudinal legs and the transversal arms. The longitudinal output leg of said ladder circuit is connected to the second input of said output multiplexer MUX.1.

By referring now to FIG. 3, it can be seen that the decoder circuit 1 is also implemented as a ladder circuit which receives input signal V(x) and includes in its longitudinal legs the blocks of circuits Decoder 2, Decoder 3 and Decoder 7. A first block FIFO.1 is included in its longitudinal parallel leg and comprises an 8-bit FIFO memory which is coupled, together with the output of a first correction block CORR coming from block Decoder 3, to a first node of the ladder incorporating a circuit XOR.5. The output of this latter circuit, V'(x), is connected to block Decoder 7 and to a second memory block FIFO.2, the output of which is coupled, together with the output of a second correction block CORR', coming from the output of block Decoder 7, to a second node of the ladder also incorporating a circuit XOR.6, and so on.

Figure 4A:
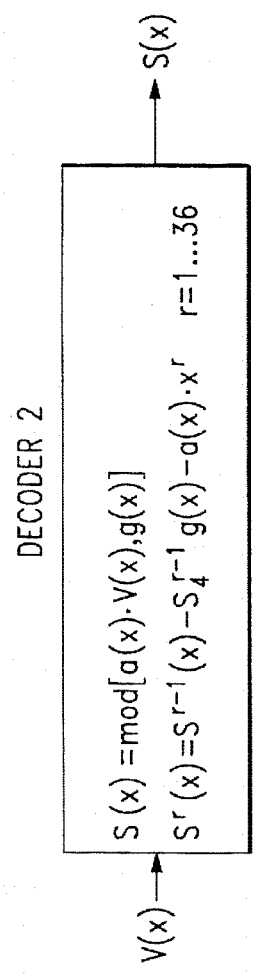
FIGS. 4A and 4B respectively show as a separate block, including the mathematics implemented therein, the circuit arrangement of decoder (2) included as a part of decoder (1) of FIG. 3.
Figure 4B:
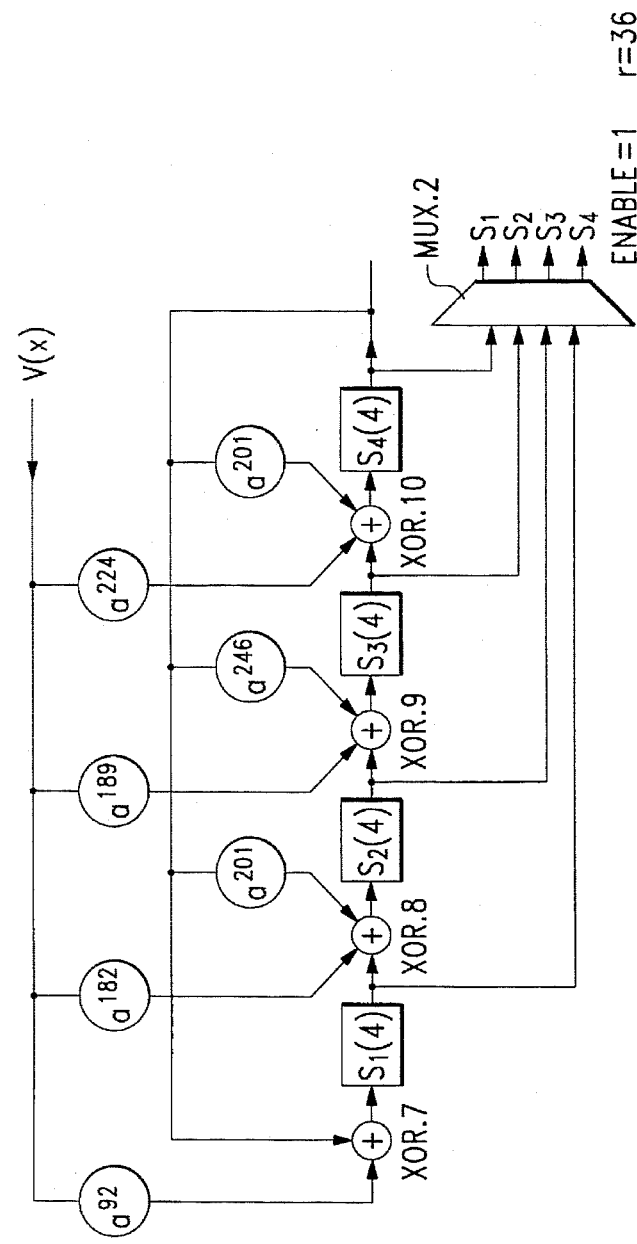

FIGS. 4A and 4B respectively show the mathematics and the circuit implementation of block Decoder 2 of FIG. 3. The circuit comprises four 8-bit multipliers: $a^{92}$, $a^{182}$, $a^{189}$ and $a^{224}$ which receive in parallel the signal representing V(x) and are connected to four XOR circuits, namely XOR.7, XOR.8, XOR.9. Downstream of each XOR circuit a master-slave flip-flop circuit is inserted, S1(4), S2(4), S3(4), S4(4) the outputs of which are all connected to an output multiplexer circuit MUX.2. The output of flip-flop S4 is directly coupled to circuit XOR.7 and is connected to circuits XOR.8, XOR.9 and XOR.10 through 8-bit multipliers $a^{201}$, $a^{246}$ and $a^{201}$, respectively. The outputs of all flip-flop circuits are multiplexed by means of a multiplexer circuit MUX.2.

By referring to FIG. 5, it can be seen that block Decoder 3 of FIG. 3, in turn, comprises a first block Decoder 4, to the outputs of which a set of blocks Decoder 5, as well as a Selection and Correction block are connected, the latter block receiving outputs VERR (error value), TANA (indication that an error exists) and CORR (position of the error) from blocks Decoder 5 and the outputs VERR and TANA from block Decoder 6. The output of the Selection and Correction block is then coupled to a circuit XOR.11 together with a signal V(x) in order to provide an output signal V'(x).

Figure 6A:
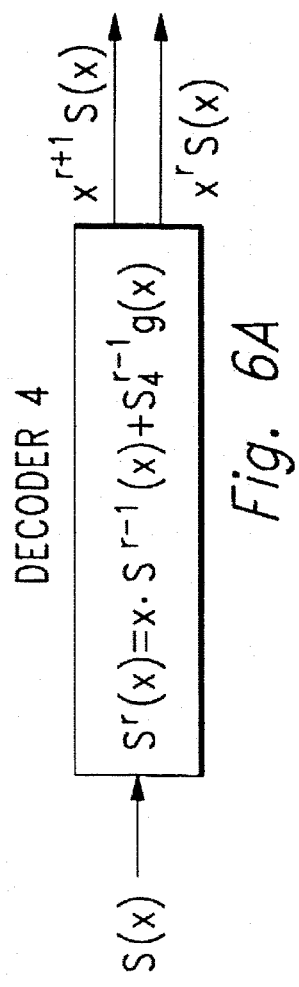
FIGS. 6A and 6B respectively show as a separate block, including the mathematics implemented therein, the circuit arrangement of decoder (4) included as a part of decoder (3) of FIG. 5.
Figure 6B:
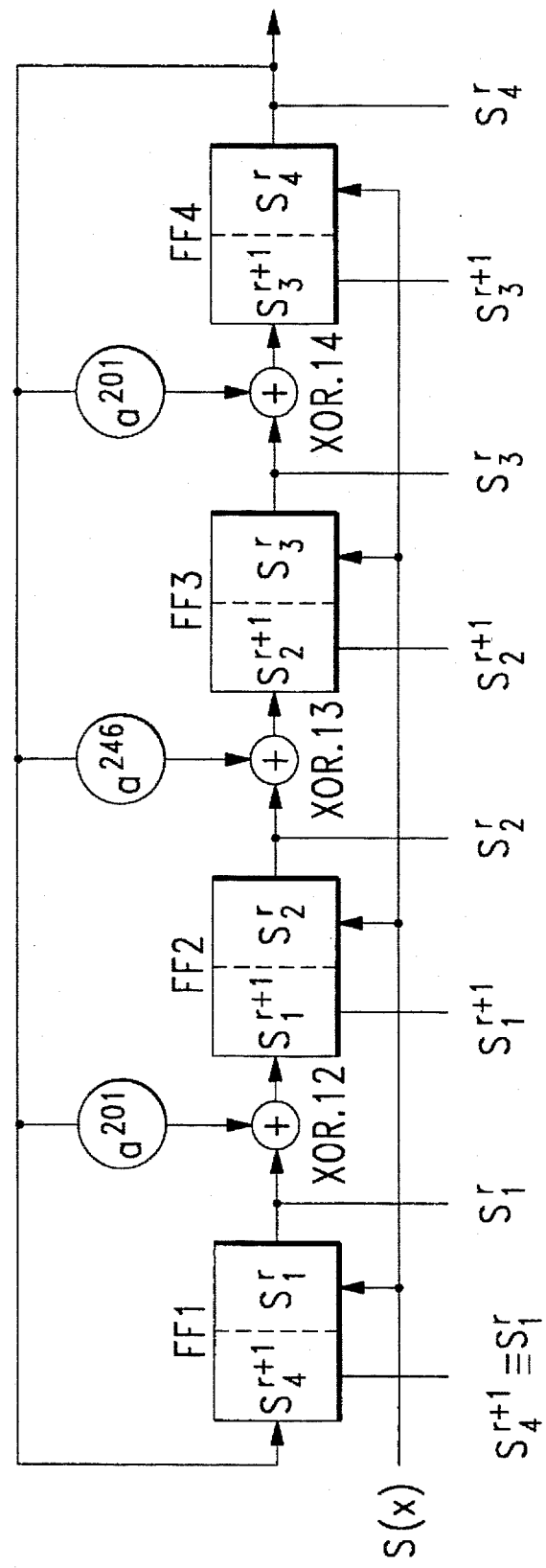

Block Decoder 4, together with the mathematics implemented therein, is shown in FIGS. 6A and 6B. By referring to FIG. 6A, it can be seen that block Decoder 4 comprises a set of four double-state, master-slave flip-flop circuits FF.1, FF.2, FF.3, FF.4, interconnected with three XOR circuits XOR.12, XOR.13 and XOR.14. The output of the last flip-flop circuit FF.4 is directly coupled to the first flip-flop circuit FF.1 and is connected to the above mentioned XOR circuits XOR.12, XOR.13 and XOR.14 by means of respective 8-bit multiplier circuits $a^{101}$, $a^{246}$ and $a^{201}$. The input signal S(x) is applied in parallel to all four flip-flop circuits.

Figures 7A, 7B:
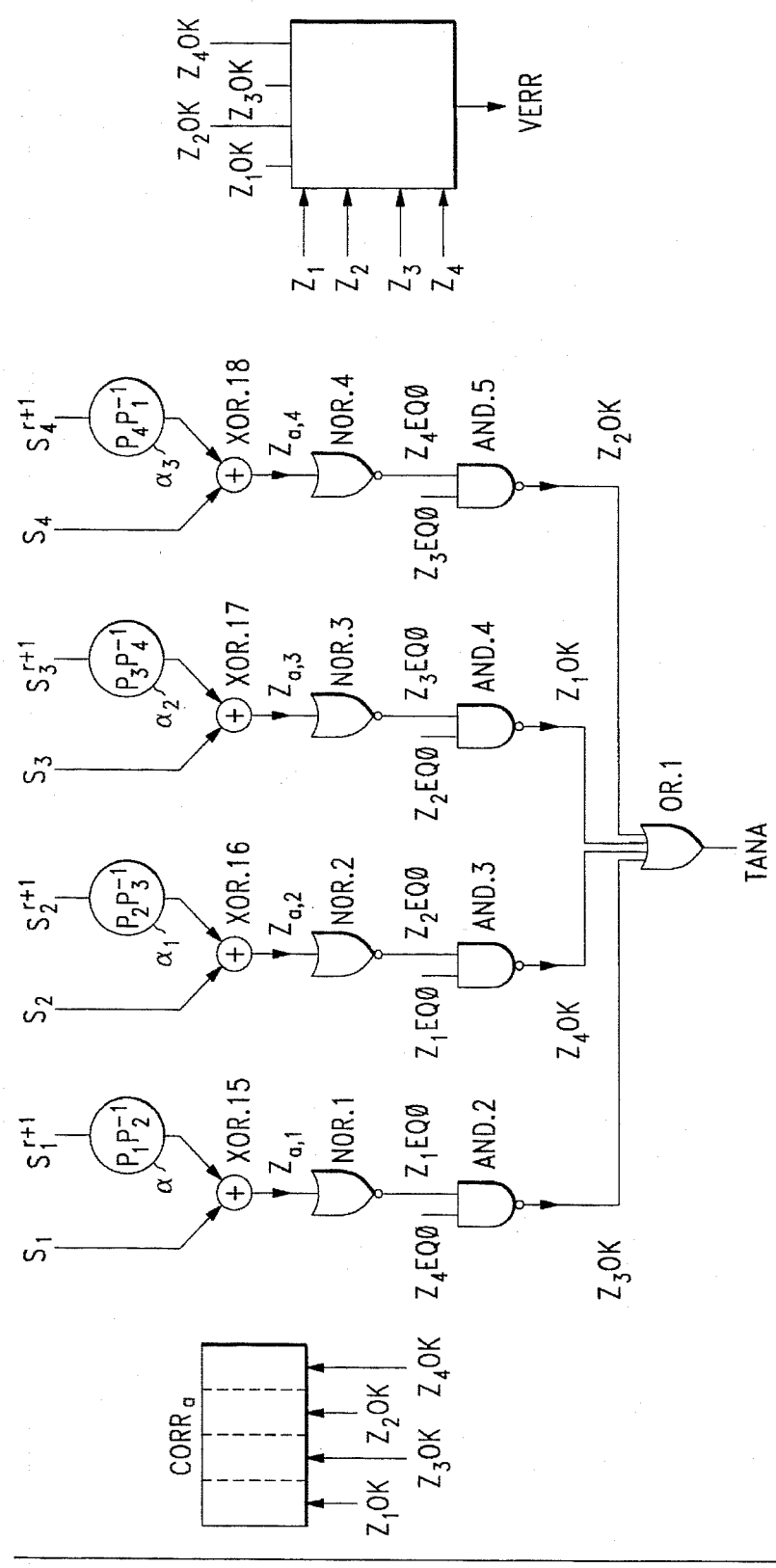
FIGS. 7A and 7B respectively show as a separate block, including the mathematics implemented therein, the circuit arrangement of one of decoders (5) included as a part of decoder 3 of FIG. 5.

Block Decoder 5, the mathematics implemented therein being set forth in FIG. 7A, is shown in FIG. 7B and will now be described. Four input connections $S_1$, $S_2$, $S_3$ and $S_4$ are presented to the circuit for directly reaching four XOR circuits of the already indicated type, namely XOR.15, XOR.16, XOR.17 and XOR.18, as well as four input connections $S_1^{(r+1)}$, $S_2^{(r+1)}$, $S_3^{(r+1)}$, $S_4^{(r+1)}$ for reaching said XOR circuit through respective 8-bit multiplier circuits $\alpha$, $\alpha_1$, $\alpha_2$, $\alpha_3$.

The outputs of said four XOR circuits XOR.15, XOR.16, XOR.17 and XOR.18 are respectively connected to a first input of four NOR gate circuits, namely NOR.1, NOR.2, NOR.3, NOR.4 the outputs of which, in turn, are connected to an input of four AND gate circuits, namely AND.2, AND.3, AND.4 and AND.5 having their outputs Ored in gate circuit OR.1.

Figure 8A:
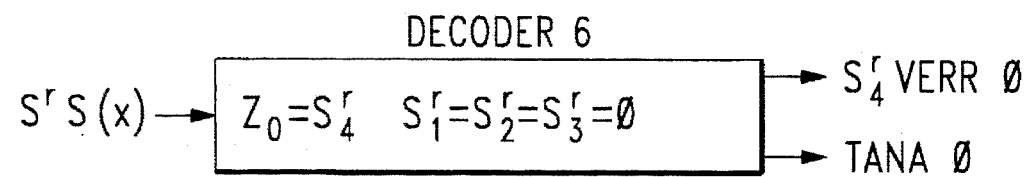
FIGS. 8A and 8B respectively show as a separate block, including the mathematics implemented therein, the circuit arrangement of decoder (6) included as a part of decoder (3) of FIG. 5.
Figure 8B:
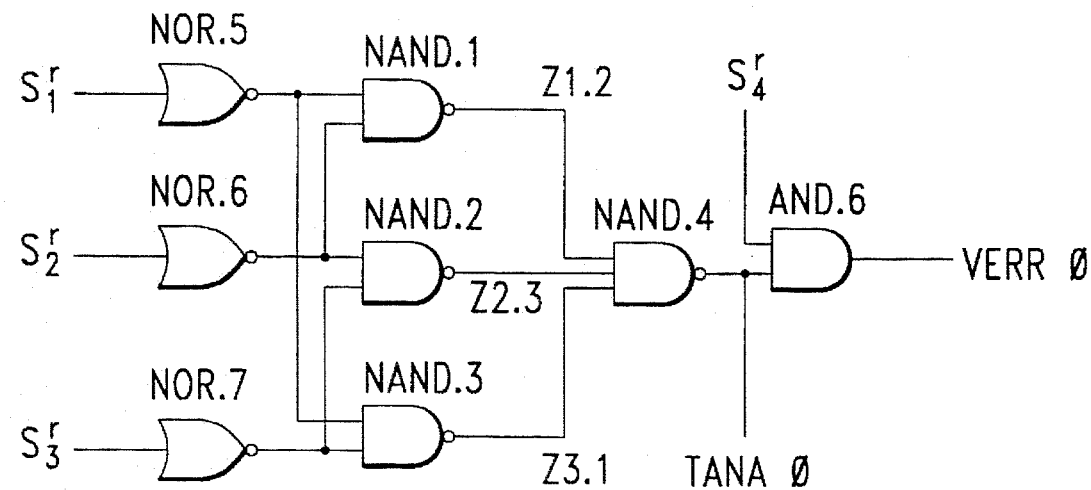

Block Decoder 6, by which the mathematics set forth in FIG. 8A is implemented, consists of the circuit shown in FIG. 8B. As it can be seen in FIG. 8B, the circuit comprises three NOR gate circuits, namely NOR.5, NOR.6 and NOR.7 to which signals $S_1^{(r)}$, $S_2^{(r)}$ and $S_3^{(r)}$ are applied. The output of circuit NOR.5 is connected to a first and to a third two-input NAND gate circuits, designated NAND.1 and NAND.3; the output of circuit NOR.6 is connected to said first and to a second NAND gate circuits, namely NAND.1 and NAND.2; the output of circuit NOR.7 is connected to the inputs of said second and of said third NAND gate circuits, namely NAND.2 and NAND.3. The outputs of said circuits NAND.1, NAND.2 and NAND.3 are combined in a further three input NAND gate circuit, NAND.4. The output of gate circuit NAND.4 is a signal TANA which, together with signal $S_4^{(r)}$, is applied to the two inputs of gate circuit AND.6 which provides output signal VERR.

Figure 9A:
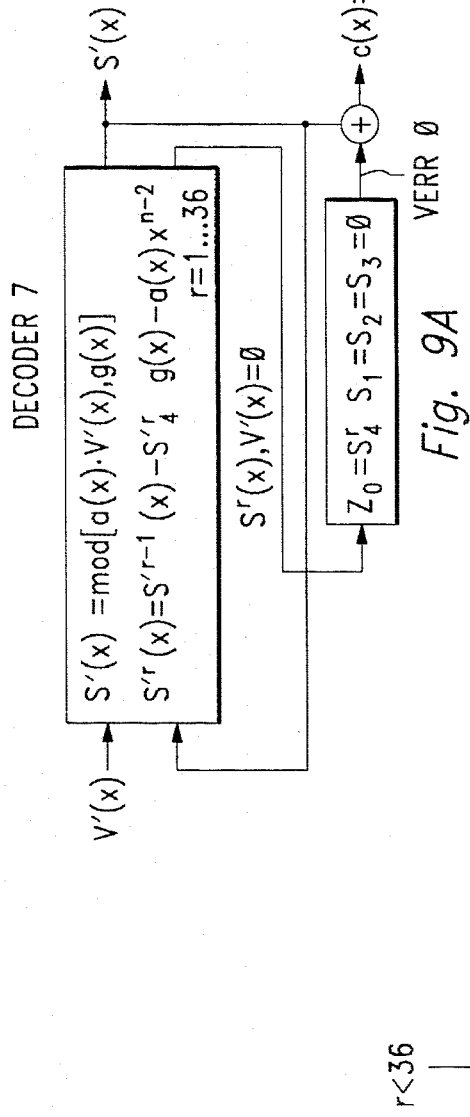
FIGS. 9A and 9B respectively show as a separate block, including the mathematics implemented therein, the circuit arrangement of decoder (7) included as a part of decoder (1) of FIG. 3.
Figure 9B:
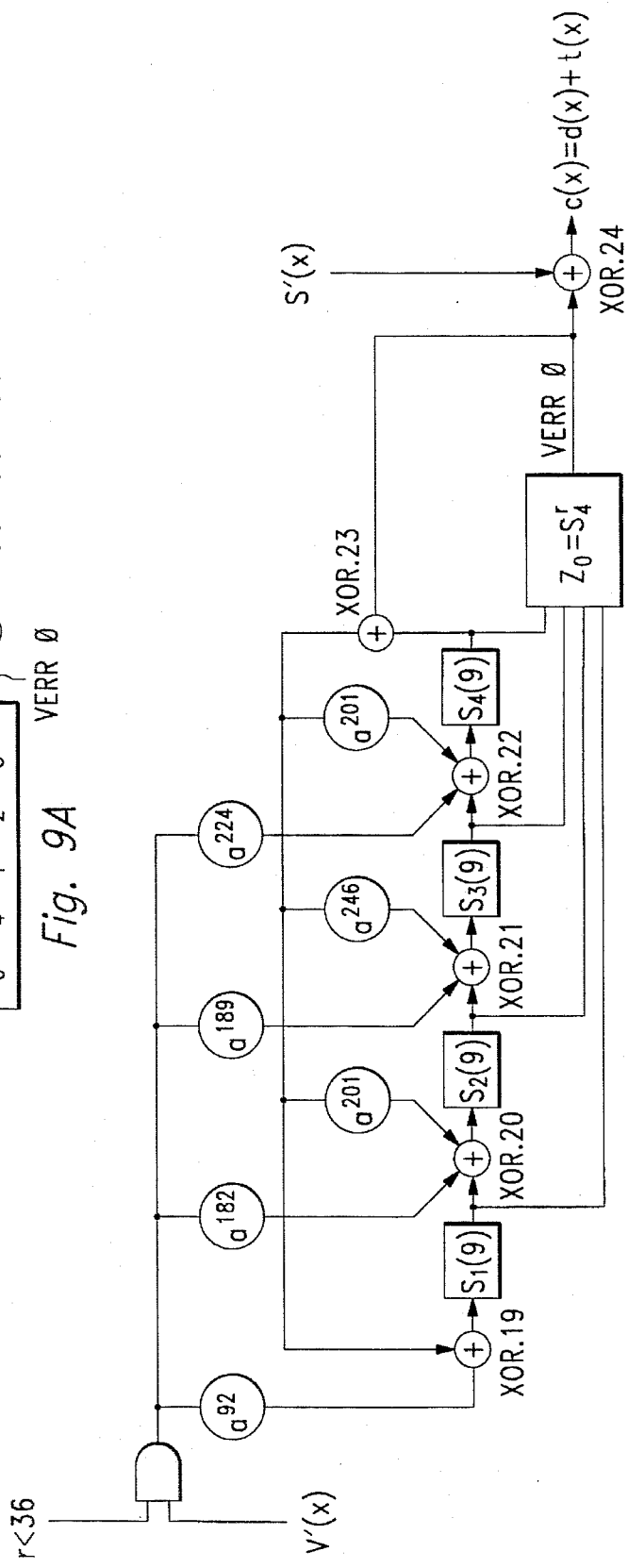

By referring now to FIGS. 9A and 9B, the implemented mathematics and the diagrammatic circuit arrangement of Decoder 7 of FIG. 3 can be observed. As it can be seen in FIG. 9B, signal V'(x) is applied in parallel to four 8-bit multiplier circuits $a^{92}$, $a^{182}$, $a^{189}$, $a^{224}$ connected to four XOR circuits, namely XOR.19, XOR.20, XOR.21 and XOR.22. Downstream of each XOR circuit a master slave flip-flop circuit is connected, namely S1(9), S2(9), S3(9), S4(9) the outputs of which are connected to a block $Z_o = S^{(r)}_4$ which provides output signal VERR. The output of the fourth flip-flop circuit S4(9) is connected through circuit XOR.23 to circuit XOR.19 and, through three parallel 8-bit multiplier circuits $a^{201}$, $a^{246}$, $a^{201}$ to the other three XOR circuits, XOR.20, XOR.21 and XOR.22. A last XOR circuit, namely XOR.24, receives signal VERR and signal S'(x) in order to furnish the following signal $$C(x)=d(x)+t(x).$$

Figure 10:
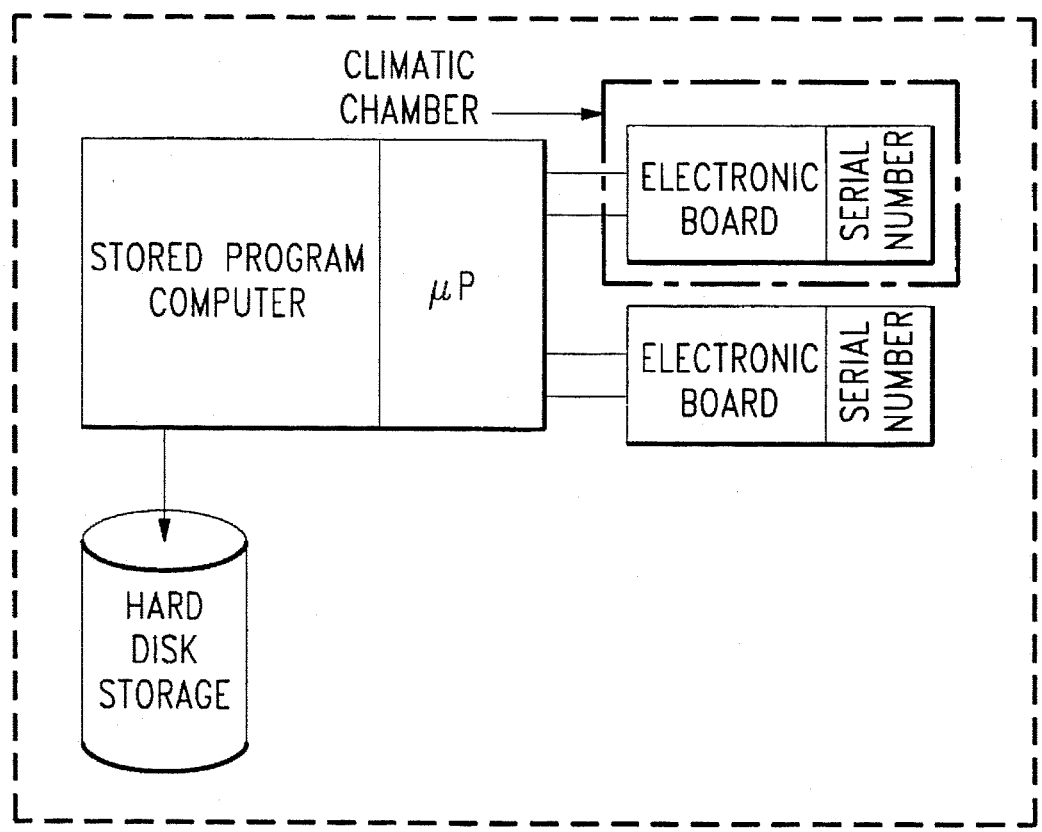
FIG. 10 shows a diagram of an equipment adapted for mapping partially faulty memories, for use according to this invention.

As far as an equipment adapted to mass production of suitably "mapped" memory products is concerned and by referring to FIG. 10, it can be seen that such an equipment comprises a computer, for instance of the kind Personal Computer, with enclosed program, associated to a rigid disk unit for storing the specific provisional maps for each device.

A microprocessor card is designated uP and is adapted to manage the memories (for reading/writing) with a cycle time duration of 50 nsec, to program external voltage generators in order to simulate limit supply conditions of the memory modules as well as the voltage levels of the input signals, to monitor the heating apparatus of the temperature-controlled chamber, by temporarily interrupting the test procedure if the temperature measured in said controlled chamber departs from the allowable range, to record the reading errors and to communicate the geometrical co-ordinates of such errors to unit uP, by referring to the memory cell matrix.

The electronic boards are housed in said climatic chambers and are standard printed circuits securing the electrical connections between the uP card and twenty memory modules. Such printer circuits are uniquely identified by means of an electronic code stored in the PROM memory.

The mapping process comprises testing the individual modules mounted upon the electronic board, firstly at high temperature, at 70° C., and then at room temperature, about 25° C., and generating the related error maps.

The electronic identification of the individual boards enables the high and low temperature maps to be drafted, while maintaining information consistency among the various boards.

Upon generating the final map, it is permanently stored in the OTP memory included in each individual memory module, under control of the computer and by means of the uP unit.

The preferred embodiment of this invention has been herein before explained, but it should be understood that those skilled in the art can made variations and changes therein without departing from the scope of this invention.

We claim:

1. A method for mapping operable homologous address locations in a semiconductor memory device having faulty locations so as to enable such semiconductor memory devices to be used, said method comprising:

organizing the semiconductor memory device as at least one memory block having a plurality of memory banks to form an elementary information word;

identifying all operable homologous address locations of the memory banks of the semiconductor memory device;

utilizing areas of the memory block having a limited number of faulty locations by applying an error correction procedure implementing a modified Reed-Solomon algorithm having a generator polynomial $$g(x)=x^4+a^{201}x^3+a^{246}x^2+a^{201}x+1$$

by translating a data string in such a manner as to move an error always to the first location of the data string;

detecting and correcting errors by logic test circuits;

establishing a map of the operable homologous address locations of the memory banks;

storing the map of operable homologous address locations of the memory banks in a non-volatile memory as data content respectively associated with the memory bank, thereby forming a transcoding table of material addresses in the non-volatile memory;

requesting access to a memory block identified by a sequential logical address;

associating the sequential logical address of the memory block to a material address of the non-volatile memory;

retrieving the data content of a selected material address from the non-volatile memory; and directly accessing the corresponding memory block enabled by the data content retrieved from the non-volatile memory at the selected material address.

2. A method as set forth in claim 1, wherein the data string includes data coefficients and control byte coefficients;

said method further including coding the data string to maintain the data coefficients separate from the control byte coefficients.

3. A method as set forth in claim 2, wherein coding of the data string is accomplished in accordance with the relationship $$c(x)=d(x)+t(x)$$

$$c_i=d_i \quad i=n, \, n-k+1$$

$$c_i=t_i \quad i=n-k, \, 1$$

$$t(x)=\mathrm{mod}\,[x^4.d(x),\,g(x)]$$

$$t^r(x)=t^{r-1}(x)-t^{r-1}+x^{n-\eta}g(x) \quad r=1,\ldots 32,$$

wherein c(x) is the coded data, d(x) is the data included in the data string, and t(x) is an error control.

4. A method as set forth in claim 3, further including decoding the data string of a plurality of bytes to compute a syndrome S(x) in accordance with the following relationships $$S(x)=\mathrm{mod}\,[a(x).V(x),\,g(x)]$$

$$S^r(x)=g^{(r-1)}(x)-S^{(r-1)}4g(x)-a(x).x^r$$

$$r=1\ldots 36,$$

wherein V(x) is received data including coded data plus error correction.

5. A method as set forth in claim 1, wherein a supply voltage is provided for the memory banks of the semiconductor memory device; further including controlling voltage conditions relating to the supply voltage for the memory banks and the voltage levels for input signals to the semiconductor memory device during the mapping of the operable homologous address locations of the memory banks.

6. A method as set forth in claim 1, wherein mapping of the operable homologous address locations in the memory banks is carried out under ambient room temperature conditions of the order of 25° C. and further under high temperature conditions of the order of 70° C.

7. A semiconductor memory mapping system for use with a semiconductor memory device having operable and faulty locations therein, wherein the semiconductor memory device is organized as a plurality of memory blocks, each memory block having a plurality of memory banks in order to form an elementary information word, said memory mapping system comprising means for organizing the operable and faulty locations in a memory block into a plurality of byte sub-strings from an individual byte string of the memory block, wherein each byte sub-string including a plurality of bytes is accompanied by a plurality of control bytes, there being a total of 36 characters in a composite unit character string including 32 characters of regular information and 4 characters for error control;

translation means operable upon a byte sub-string of regular characters and error control characters for transposing a detected error in the character string to the first location of the character string;

test control logic circuits for detecting an error located in the first location of the translated 36 character string and for correcting the error existing in the first location; and said test control logic circuits being responsive to the identification of a polynomial expression indicative of the presence of an error in a byte string, the polynomial structure being in the form of a modified Reed-Solomon algorithm with a generator polynomial in the form $$g(x)=x^4+a^{201}x^3+a^{246}x^2+a^{201}x+1.$$

8. A memory mapping system as set forth in claim 7, further including a coder circuit for operating upon a respective 36-character string having data coefficient locations and control byte coefficients to maintain the data coefficient locations separate from the control byte coefficients in the 36-character string in accordance with the following mathematical relationships $$c(x)=d(x)+t(x)$$

$$c_i=d_i \quad i=n, n-k+1$$

$$c_i=t_i \quad i=n-k, 1$$

$$t(x)=\mod [x^4 \cdot d(x), g(x)]$$

$$t^r(x)=t^{r-1}(x)-t^{r-1}+x^{n-n}g(x) \quad r=1, \ldots 32,$$

wherein
c(x) is the coded data,
d(x) is the data included in the data string, and
t(x) is an error control.

9. A memory mapping system as set forth in claim 8, wherein said coder circuit comprises a ladder network having four transversal arms and two longitudinal legs forming opposite sides of the ladder network between which the four transversal arms extend, said coder circuit including a first 8-bit exclusive-OR logic circuit in one transversal arm of the ladder network for receiving an input signal;

an output multiplexer circuit having first and second inputs, the first input of said output multiplexer circuit receiving the input signal;

an AND logic gate circuit included in a first longitudinal leg forming one side of the ladder network and having first and second inputs for respectively receiving a first selection signal and the output of said first exclusive-OR logic circuit;

respective 8-bit multiplier circuits provided in each of the remaining three transversal arms of said ladder network;

a second longitudinal leg forming the other side of the ladder network including four master-slave flip-flop circuits;

respective exclusive-OR logic circuits being disposed at nodes formed by the remaining three transversal arms and the second longitudinal leg forming the other side of said ladder network and alternating with said master-slave flip-flop circuits in the second longitudinal leg of said ladder network; and the fourth flip-flop circuit disposed in the second longitudinal leg of said ladder network being connected to the second input of said output multiplexer circuit.

10. A memory mapping system as set forth in claim 7, further including a decoder circuit for correcting errors within a syndrome of four bytes, said decoder circuit including a first decoder block, a second decoder block and a third decoder block connected in cascade;

a first memory block of a first in-first out data memory connected in parallel with respect to said first decoder block;

a first exclusive-OR logic circuit connected to the output of said first memory block and the output of said second decoder block;

a first correction block interposed in the connection between the output of said second decoder block and said first exclusive-OR logic circuit;

a second memory block of a first in-first out memory;

the output of said first exclusive-OR logic circuit being connected to an input of said third decoder block and to said second memory block;

a second exclusive-OR logic circuit having an input connected to the output of said third decoder block and an input connected to the output of said second memory block; and a second correction block interposed in the connection between the output of said third decoder block and an input of said second exclusive-OR logic circuit.

11. A memory mapping system as set forth in claim 10, wherein said first decoder block comprises:

a first set of four 8-bit multiplier circuits connected in parallel with respect to each other for receiving an input signal;

four exclusive-OR logic circuits having inputs for respectively receiving the output of a corresponding one of said four 8-bit multiplier circuits;

four master-slave flip-flop circuits respectively connected to the outputs of a corresponding one of said four exclusive-OR logic circuits;

a second set of three 8-bit multiplier circuits connected in parallel with respect to each other;

the output of the last one of said master-slave flip-flop circuits being connected directly to the first one of said four exclusive-OR logic circuits and to the remaining three exclusive-OR logic circuits via corresponding ones of said second set of three 8-bit multipliers; and a multiplexer circuit having respective inputs for receiving the outputs of all of said master-slave flip-flop circuits.

12. A memory mapping system as set forth in claim 10, wherein said second decoder block comprises:

a first decoder block;

a set of identical decoder blocks and a further decoder block connected in parallel with respect to each other and to the output of said second decoder block;

a selection and correction block for receiving the outputs from said set of identical decoder blocks and said further decoder block; and an exclusive-OR logic circuit having inputs for respectively receiving the output of said selection and correction block and a signal V(x) and providing an output signal V'(x).

13. A memory mapping system as set forth in claim 12, wherein said first decoder block of said second decoder block comprises:

a set of four double-state master-slave flip-flop circuits;

three exclusive-OR logic circuits, a corresponding one of said three exclusive-OR logic circuits being interconnected between successive double-state master-slave flip-flop circuits so as to provide alternating double-state master-slave flip-flop circuits and an exclusive-OR logic circuit;

the output of the last flip-flop circuit being connected directly to the first flip-flop circuit;

three 8-bit multiplier circuits connected in parallel with respect to each other and respectively connected to an input of a corresponding one of said three exclusive-OR logic circuits;

the output of the last flip-flop circuit being respectively connected to each of said three exclusive-OR logic circuits through the respective 8-bit multiplier circuit; and each of said four flip-flop circuits being connected in parallel to receive the input signal.

14. A memory mapping system as set forth in claim 12, wherein said set of identical decoder blocks comprises first and second sets of four input connections;

four exclusive-OR logic circuits coupled to said first set of four input connections;

four 8-bit multiplier circuits connected to said second set of four input connections and having respective outputs connected to a corresponding one of said four exclusive-OR logic circuits;

four NOR gate circuits respectively connected to the outputs of said four exclusive-OR logic circuits;

four AND logic gate circuits, a respective one of said four AND logic gate circuits having an input connected to the output of a corresponding one of said four NOR logic gate circuits; and an OR logic gate circuit having inputs connected to the outputs of said four AND logic gate circuits.

15. A memory mapping system as set forth in claim 12, wherein said further decoder block comprises:

first, second, and third NOR logic gate circuits;

first, second, and third NAND logic gate circuits;

said first NOR logic gate circuit having an output connected to said first and third NAND logic gate circuits;

said second NOR logic gate circuit having an output connected to said first and second NAND logic gate circuits;

said third NOR logic gate circuit having an output connected to said second and third NAND logic gate circuits;

a fourth NAND logic gate circuit having three inputs respectively connected to the outputs of said first, second and third NAND logic gate circuits and providing a signal TANA as an output; and an AND logic gate output circuit having first and second inputs respectively receiving the output signal TANA from said fourth NAND logic gate circuit and a signal $S_4^{(r)}$.

16. A memory mapping system as set forth in claim 10, wherein said third decoder block comprises:

four exclusive-OR logic gate circuits;

four master-slave flip-flop circuits interconnected with said four exclusive-OR logic circuits in an alternating sequence such that each of said four exclusive-OR logic circuits is followed by a master-slave flip-flop circuit;

four 8-bit multiplier circuits connected in parallel for receiving an input signal V'(x) and having outputs connected to an input of a corresponding one of said four exclusive-OR logic circuits;

a signal block for providing an output signal VERR having respective inputs for receiving the outputs of said four master-slave flip-flop circuits;

a further exclusive-OR logic circuit having an output connected to the first exclusive-OR logic circuit included in said four exclusive-OR logic circuits and to inputs of the remaining three exclusive-OR logic circuits;

three 8-bit multiplier circuits interposed in the connection between the output of said further exclusive-OR logic circuit and the inputs of said remaining three exclusive-OR logic circuits; and a final exclusive-OR logic circuit having an input connected to said signal block for receiving the output signal VERR and a second input for receiving a signal S'(x) and providing as an output a signal c(x)=d(x)+t(x), wherein S'(x) is a syndrome signal, c(x) is the coded data, d(x) is the data included in the data string, and t(x) is an error control.

\* \* \* \* \*